United States Patent [19]

Heck

[11] Patent Number: 5,109,531

[45] Date of Patent: Apr. 28, 1992

[54] SIDEBAND RECEIVER WITH PILOT LOCK

[75] Inventor: Joseph P. Heck, Fort Worth, Tex.

[73] Assignee: Motorola, Inc., Schaumburg, Ill.

[21] Appl. No.: 316,736

[22] Filed: Feb. 28, 1989

[51] Int. Cl.$^5$ ............................................. H04B 1/16
[52] U.S. Cl. ....................................... 455/47; 455/203
[58] Field of Search ................... 455/46, 47, 702, 203, 455/239, 260, 265, 266, 234, 324; 331/12; 375/106-109

[56] References Cited

U.S. PATENT DOCUMENTS

| | | | |
|---|---|---|---|
| 4,596,046 | 6/1986 | Richardson et al. | 455/203 |
| 4,642,573 | 2/1987 | Noda et al. | 455/202 |
| 4,653,117 | 3/1987 | Heck | 455/209 |
| 4,718,116 | 1/1988 | Jacobs et al. | 455/203 |

OTHER PUBLICATIONS

A Dec., 1956 Article From the "Proceedings of the Ire" by Weaver is entitled A Third Method of Generation and Detection of Single Sideband Signals.
A Dec., 1956 Article by Norgaard is entitled "The Phase-Shift Method of Single-Sideband Signal Generation".
A Dec., 1956 Article From the "Proceedings of the Ire" by Norgaard is entitled The Phase-Shift Method of Single-Sideband Signal Reception.

Primary Examiner—Curtis Kuntz
Attorney, Agent, or Firm—Steven G. Parmelee

[57] ABSTRACT

A sideband receiver that locks to a pilot component of a received signal. The pilot component is down-converted and then up-converted prior to phase comparing the pilot component information to provide a lock function. The receiver architecture allows monolithic integration of the receiver on a single integrated circuit (401).

16 Claims, 2 Drawing Sheets

SIDEBAND RECEIVER WITH PILOT LOCK

TECHNICAL FIELD

This invention relates generally to RF receivers, and particularly to sideband receivers.

BACKGROUND ART

Sideband RF communication devices, such as single sideband (SSB) devices, tend to be complex and require the use of expensive components. Filters, balanced modulators, mixers, and pilot carrier phase locking requirements tend to result in high product cost and parts count. Further, available tolerance levels for reasonably priced components may be inadequate to support desired performance levels.

A need exists for a practical design that allows sideband reception with a reduced cost platform. Preferably, such a platform should be substantially amenable to monolithic integration of many, if not all, of its constituent components.

SUMMARY OF THE INVENTION

These needs are substantially met through provision of the sideband receiver disclosed herein. This receiver receives a signal that includes at least a pilot component and an information component. The receiver down converts at least the pilot component substantially to baseband by mixing the pilot component with a first reference signal. The receiver then up-converts this resultant signal and compares the up-converted signal with a second reference signal to obtain a control signal. This control signal is then used, in PLL fashion, to control the first reference signal to thereby allow the radio to accurately lock with respect to the pilot component.

In one embodiment, the information component can be extracted through use of the well known Weaver method of detecting sideband signals.

BEST MODE FOR CARRYING OUT THE INVENTION

Figure 1:
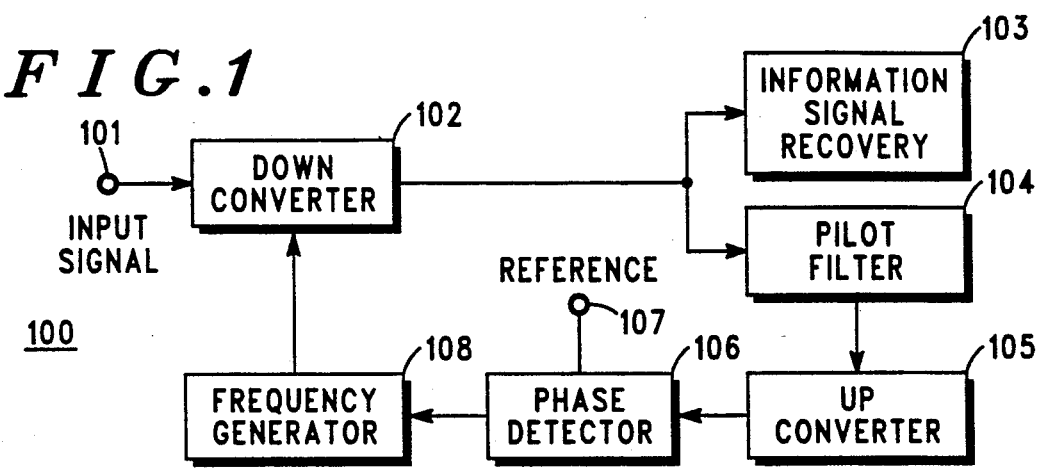
FIG. 1 provides a block diagram depiction of the receiver.

In FIG. 1, the receiver can be seen as depicted generally by the numeral 100. The receiver (100) receives an input signal (101) that includes at least both a pilot component, such as a pilot carrier, and an information component, such as a single sideband voice signal. This input signal (101) is provided to a down-converter (102) that down converts the received signals, including the pilot component, substantially to baseband. The resultant baseband signal is then provided to an information signal recovery unit (103) that extracts the information component, and to a pilot filter (104) that selects only the pilot component of the down converted signal.

The selected pilot component is then up converted by an up-converter (105) and compared in a phase detector (106) with a predetermined reference signal (107). The output of the phase detector (106) controls a frequency generator (108) that in turn controls the down conversion process. As a result, the receiver reliably and economically locks to the pilot component of the input signal (101).

Figure 2:
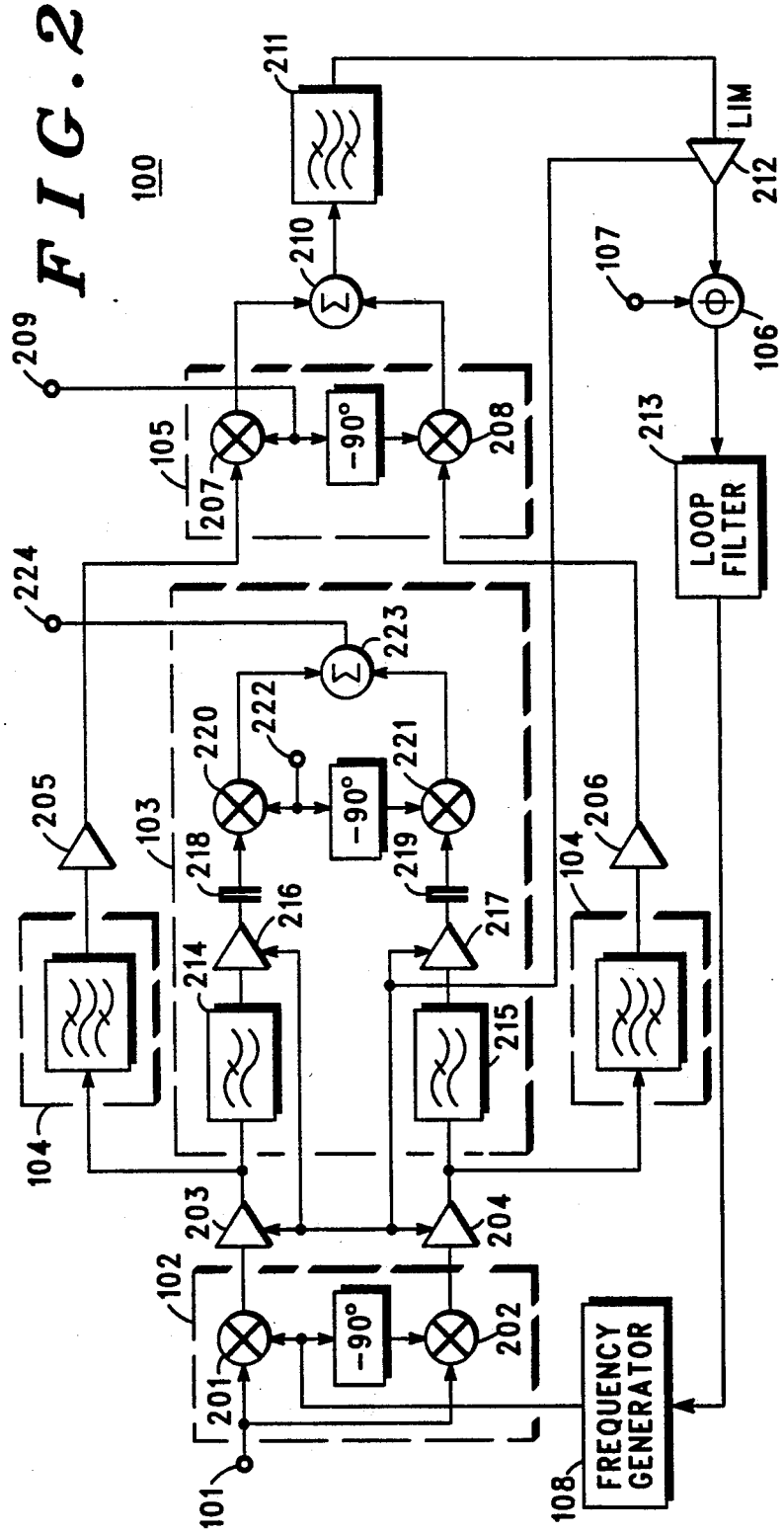
FIG. 2 comprises a detailed block diagram depiction of the receiver.

With reference to FIG. 2, the down-converter (102) includes two mixers (201 and 202) that down-convert the input signal (101) to two baseband signals in quadrature with one another. Both mixers (201 and 202) use an injection signal sourced by the frequency generator (108) that is in turn controlled by the pilot component phase detector (106), all as described in more detail below.

The mixers couple through appropriate amplifiers (203 and 204) to both the information signal recovery section (103) and the pilot filters (104). The pilot filters (104) connect through another set of amplifiers (205 and 206) to a pair of mixers (207 and 208) in the up-converter (105). Using an appropriate injection signal (209), these mixers (207 and 208) up-convert the substantially baseband pilot component (both the original and the quadrature component thereof) in frequency by an amount that may be between 100 kHz and 200 kHz, following which the up-converted signals are summed (210) and bandpass (or lowpass) filtered (211).

The combined and filtered pilot component signal passes through an amplifier and limiter (212) that functions in part to provide an AGC signal to various amplifier stages as depicted. The output of the limiter couples to the phase detector (106) that functions to compare the up-converted pilot component with a reference (107). The output from the phase detector (106) passes through a loop filter (213) to provide the appropriate control signal to the frequency generator (108).

The information signal recovery section (103) of the receiver (100) substantially implements a Weaver signal recovery. The baseband recovered signals are passed through a lowpass filter (214 and 215), amplifier (216 and 217), and coupling capacitor (218 and 219) to mixers (220 and 221) that mix these signals with an appropriate reference signal (222). The resultant signals are summed (223) and provided as a demodulated audio output (224) that can be further amplified as necessary and transduced into acoustic form.

Figure 5:
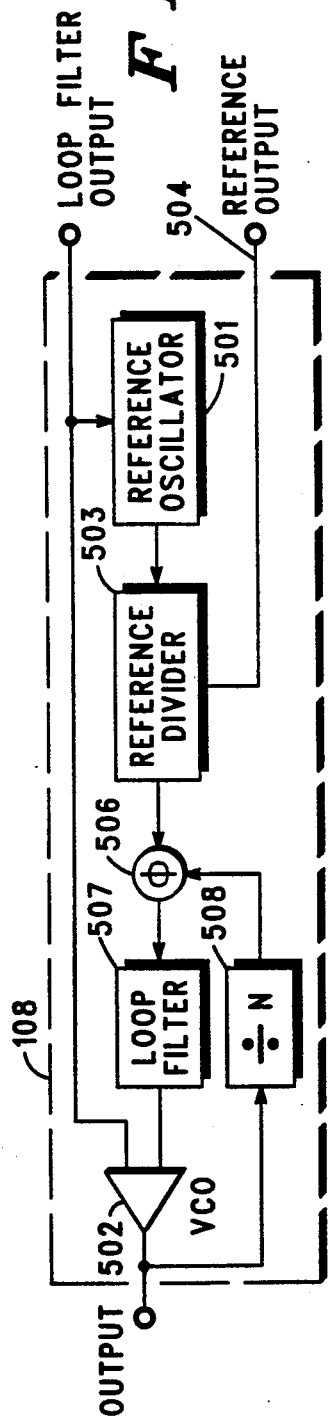
FIG. 5 comprises a block diagram depiction of the frequency generator.

A frequency generator appropriate for use with this invention will be described with reference to FIG. 5. The output of the loop filter (213) couples to both a modulation port of a reference oscillator (501) and to one control port of dual port VCO (502). The reference oscillator (501) provides an output to a reference divider (503), the latter then providing a reference signal (504) for use elsewhere in the circuit as noted above and a reference signal to a phase detector (506). The phase detector (506) comprises a part of a PLL that includes the VCO (502) along with an appropriate loop filter (507) and divider (508). The output of the VCO (502) then provides the appropriate injection frequency for the down converter (102) described above. (In the alternative, the frequency generator could be provided through use of an appropriate crystal oscillator having a modulation port).

Figure 3:
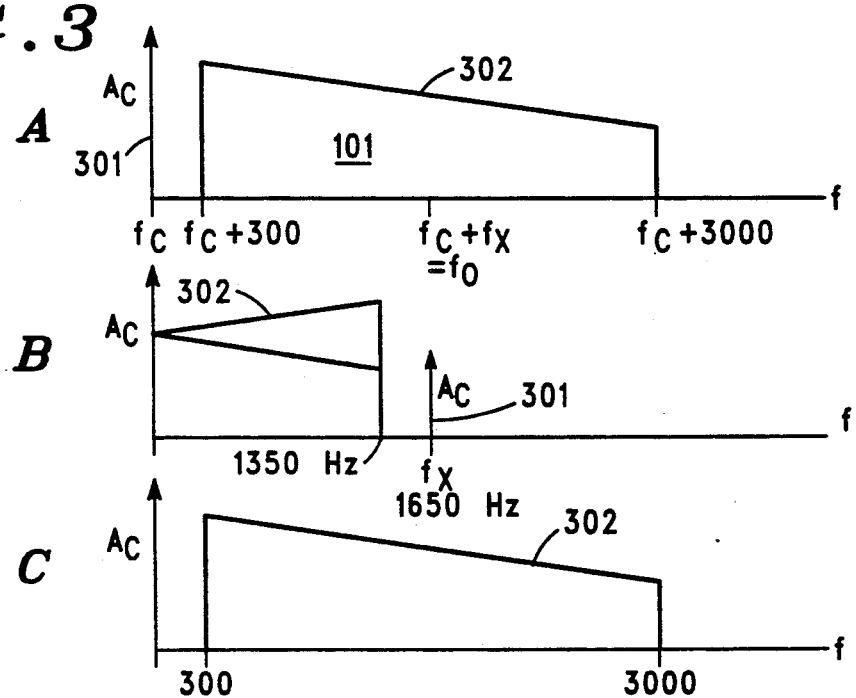
FIG. 3 comprises spectra depictions representative of signal processing through the receiver.

With reference to FIG. 3, operation of the receiver (100) can be described.

Referring to FIG. 3a, the original input signal (101) includes, in this example, a pilot carrier (301) at the carrier frequency ($F_c$) and an information component (302) located in a single sideband. (The information component is positioned between a low end frequency of $F_c+300$ Hz and a high end frequency of $F_c+3000$ Hz. The midpoint ($F_o$) of the information component equals the pilot carrier frequency $F_c+F_x$, (in this embodiment, $F_x$ would be 1650 Hz.

FIG. 3b provides a spectral depiction of the output of the down-convertor (102) (keeping in mind, of course, that the output from each mixer (201 and 202) would differ from one another in quadrature due to the 90° phase shift introduced by the down-converter between the two mixer outputs). Presuming that the output of the frequency generator (108) provides an injection signal $F_o$, (where $F_o=F_c+F_x$) the information component (302) will fold upon itself as depicted, such that the information component information will appear in the 0 to 1350 Hz. range, and the pilot carrier (301) will appear at $F_x$ (1650 Hz).

Referring to FIG. 3c, the output of the information signal recovery section (103) comprises the information component (302) as properly recovered.

To implement the above example, the lowpass filters (214 and 215) of the information signal recovery section (103) should have a corner frequency of 1350 Hz., to thereby allow the information component (302) to pass therethrough and to block passage of the pilot carrier (301). Similarly, the pilot filters (104) should have a bandpass frequency of 1650 Hz. to allow passage of the pilot carrier (301) and to block passage of the information component (302) and any other signal information or interference that may be present.

So configured, the receiver (100) will lock to the pilot component of the input signal (101) and provide a reliably recovered information component signal as an audio output.

Figure 4:
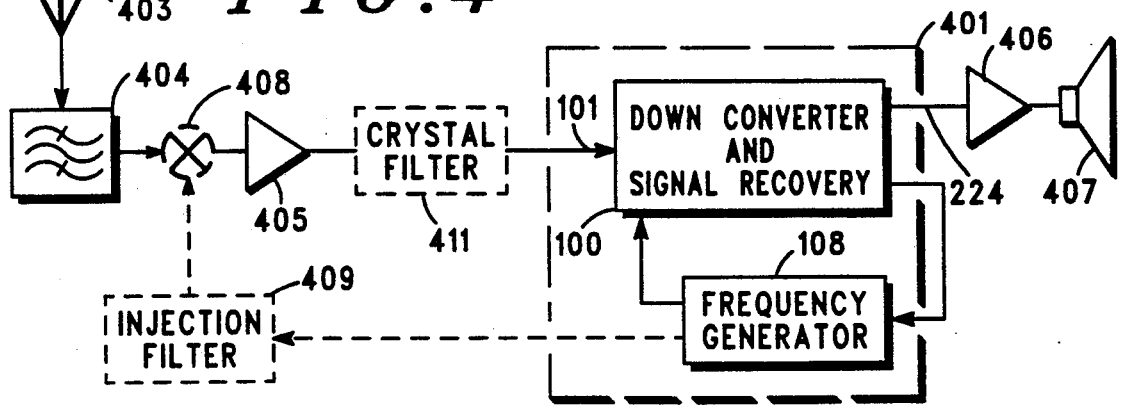
FIG. 4 comprises a block diagram form of an IC implemented version of the receiver.

With reference to FIG. 4, it can be seen that the architecture of this particular receiver accommodates monolithic integration of all of its depicted functions on a single integrated circuit (401), which circuit may also include the frequency generator (402) to provide the necessary reference signals (107) referred to above. Outboard components could include an appropriate antenna (403), a preselector filter (404) and a preamplifier circuit (405) that function in combination to receive, preselect, and preamplify the input signal (101). The recovered audio output (224) of the receiver in turn can be provided to an appropriate audio amplifier section (406) before being provided to an appropriate acoustic transducer (407).

In an alternative embodiment, as depicted by phantom lines, an IF stage could be provided, including a first mixer (408), an injection filter (409), and an appropriate crystal filter (411). So configured, the down converter circuit (100) would not be required to reduce the received signal from the original carrier frequency; instead the down converter would operate on the IF frequency provided at the output of the crystal filter (411).

What is claimed is:
1. A method of receiving a signal having at least a pilot component and an information component, comprising the steps of:
   A) providing a first and second reference signal;
   B) down-converting at least the pilot component by mixing at least the pilot component with the first reference signal to provide a down-converted pilot component;
   C) up-converting the down-converted pilot component to provide an up-converted pilot component;
   D) comparing the up-converted pilot component with the second reference signal to provide a control signal;
   E) using the control signal to control, at least in part, the first reference signal.

2. The method of claim 1 wherein said pilot component comprises a pilot carrier.

3. The method of claim 1 wherein said step of up-converting the down-converted pilot component provides an up-converted pilot component that is up-converted in frequency by an amount between 100 kHZ to 200 kHz.

4. The method of claim 1 wherein said step of down-converting includes down-converting both the pilot component and the information component.

5. The method of claim 4 wherein said step of up-converting comprises up-converting the down-converted pilot component only.

6. The method of claim 1, wherein step A down-converts at least the pilot component to baseband.

7. A receiver for receiving a signal having at least a pilot component and an information component, comprising:
   A) reference signal generating means for providing a first reference signal as a function, at least in part, of a control signal;
   B) second means for providing a second reference signal;
   C) down-converting means for receiving said signal and for down-converting at least the pilot component, said down-converting means including mixing means for mixing at least the pilot component with the first reference signal to provide the down-converted pilot component;
   D) up-conversion means for up-converting the down-converted pilot component to provide an up-converted pilot component;
   E) comparison means for comparing the up-converted pilot component with the second reference signal to provide the control signal.

8. The receiver of claim 7 wherein said pilot component comprises a pilot carrier.

9. The receiver of claim 8 wherein the up-conversion means up-converts the down-converted pilot component by an amount between 100 kHz to 200 kHz.

10. The receiver of claim 7 wherein the down-conversion means down-converts both the pilot component and the information component.

11. The receiver of claim 10 wherein the up-conversion means up-converts the down-converted pilot component only.

12. The receiver of claim 7, wherein the down-converting means down-converts at least the pilot component to baseband.

13. A sideband signal receiver for receiving a signal having at least a pilot component and a sideband information component, comprising an integrated circuit including:
   A) RF signal input means for receiving the pilot component and information component;
   B) down conversion means for down-converting the received signal as a function, at least in part, of a reference signal;
   C) information component recovery means for recovering the information component and rendering said information component audible; and D) pilot component locking means responsive to the down-conversion means for causing the RF signal input means to lock to the signal as a function of the pilot component.

14. The receiver of claim 13 wherein the pilot component locking means includes up-conversion means for up-converting the pilot component.

15. The receiver of claim 14 wherein the pilot component locking means further includes comparison means for comparing the up-converted pilot component with a second reference signal.

16. The receiver of claim 15 wherein the pilot component locking means further includes a control reference signal means responsive to the comparison means for providing the first reference signal to the down-conversion means.

* * * * *